United States Patent [19]

Kobayashi et al.

[11] Patent Number: 4,621,412

[45] Date of Patent: Nov. 11, 1986

[54] MANUFACTURING A COMPLEMENTARY MOSFET

[75] Inventors: Kazuyoshi Kobayashi; Yoshio Harada, Kanagawa, both of Japan

[73] Assignee: Sony Corporation, Tokyo, Japan

[21] Appl. No.: 651,079

[22] Filed: Sep. 17, 1984

[51] Int. Cl.⁴ .......................................... H01L 21/425
[52] U.S. Cl. .................... 29/571; 29/577 C; 29/578; 29/576 B; 148/187
[58] Field of Search ............... 29/571, 577 C, 578; 148/187

[56] References Cited

U.S. PATENT DOCUMENTS

| | | | |
|---|---|---|---|
| 4,295,897 | 10/1981 | Tubbs et al. | 148/1.5 |
| 4,313,768 | 2/1982 | Sanders et al. | 148/187 X |
| 4,355,454 | 10/1982 | Tasch et al. | 148/187 X |
| 4,385,827 | 5/1983 | Romano-Moran et al. | 29/571 X |
| 4,385,947 | 5/1983 | Halfacre et al. | 148/187 |
| 4,422,885 | 12/1983 | Brower et al. | 148/187 X |
| 4,434,543 | 3/1984 | Schwabe et al. | 29/576 B |
| 4,450,021 | 5/1984 | Batra et al. | 29/571 |
| 4,459,740 | 7/1984 | Schwabe et al. | 29/576 B |
| 4,462,151 | 7/1984 | Geipel et al. | 148/187 X |
| 4,470,852 | 9/1984 | Ellsworth | 148/187 |
| 4,530,150 | 7/1985 | Shirato | 29/576 B |

*Primary Examiner*—George T. Ozaki
*Attorney, Agent, or Firm*—Hill, Van Santen, Steadman & Simpson

[57] ABSTRACT

A manufacturing method of a semiconductor device is disclosed which includes the steps of forming oxide layers on a major surface of a substrate at first and second portions, forming first and second semiconductor layers, each having predetermined conductivity types and with predetermined patterns on the oxide layers of the first and second portions, forming a first region by introducing an impurity of the first conductivity type into the substrate while using the first semiconductor layer as a mask, etching out the oxide layer on the second portion by using the second semiconductor layer as a mask, forming a second region by introducing an impurity of the second conductivity type into the substrate while using the second semiconductor layer as a mask, and forming oxide layers on the surfaces of the first semiconductor layer, the second semiconductor layer and the second region by a thermal oxidization process.

1 Claim, 17 Drawing Figures

MANUFACTURING A COMPLEMENTARY MOSFET

BACKGROUND OF THE INVENTION

1. Field of the Invention

This invention generally relates to a manufacturing method of a semiconductor device and more particularly to a manufacturing method for producing a complementary metal oxide semiconductor transistor, such as, a C-MOS transistor.

2. Description of the Prior Art

C-MOS transistors must be constructed to high standards of performance. FIGS. 1A to 1G respectively illustrate an example of a prior art manufacturing method of the C-MOS transistor. In accordance with the prior art manufacturing method, as shown in FIG. 1A, on a major surface of a semiconductor substrate 1 of a second conductivity type, for example, N-type at portions where N channel and P channel MOS transistors are respectively to be formed, there are respectively formed thin insulating layers (for example, SiO$_2$ layers) 2 which will serve as gate insulating layers. Selectively formed on the respective insulating layers 2 are polycrystalline silicon layers 3, 3' containing, for example, phosphorus which will become gate electrodes. A first conductivity type, namely, P-type island region 4 is formed in the substrate and field oxide layers (SiO$_2$ layers) 5 having large thicknesses are formed on the major surface of the substrate 1 at field portions by selective oxidation thereof. In the portions of the substrate 1 beneath the field oxide layers 5, channel stopper regions 6 may be previously formed. Then, as shown in FIG. 1B, the N channel side is masked with a photoresist layer 7 and then B+ ions of boron are implanted into the substrate 1 with an implantation energy of 50 KeV and at a dosage of $5 \times 10^{14}$ cm$^{-2}$ to form a source region 8S and a drain region 8D for the P channel. Then, as shown in FIG. 1C, the P channel is masked with a photoresist layer 7 and P+ phosphorus ions are implanted into the substrate 1 with an implantation energy of 80 KeV and at a dosage of $5 \times 10^{15}$ cm$^{-2}$ to form a source region 9S and a drain region 9D for the N channel. The semiconductor device is then subjected to an annealing treatment and an oxidation treatment so as to form oxide layers (SiO$_2$) 10 on the surfaces of both of the polycrystalline silicon layers 3 and 3'. The oxide layers 10 are used to prevent, for example, an arsenosilicate glass layer which will be formed later and the polycrystalline silicon layers 3 and 3' which contains phosphorus from reacting with each other. Then, as shown in FIG. 1E, a silicate glass layer 11 such as arseno-silicate glass phosphorus silicate glass or the like is deposited on the entire surface of the semiconductor device by the CVD (chemical vapor deposition) method. Then contact window apertures are formed through the silicate glass layer 11, and glass-flow treatment is carried out. The first wiring 12 of Al is formed, thus forming the C-MOS transistors comprising the N channel MOS(N-MOS) transistor and the P channel MOS (P-MOS) transistor, as shown in FIG. 1F.

Thereafter, when double layer wiring is formed, as shown in FIG. 1G, an insulating layer 13 made of, for example, silicate glass for insulation between adjacent layers is deposited on the first Al wiring 12 and through the insulating layer 13 contact window apertures are formed. Then, a second wire conductor 14 made of Al is formed and an insulation protective layer 15 is formed on the entire surface of the semiconductor device thus formed.

Such prior art manufacturing method, however, have the following disadvantages. When the source region 9S and the drain region 9D of the N channel side are formed by the ion implantation technique, if P+ phosphorus ions are used, there is no problem because the projection range R$_p$ is large. However, when the source region 9S and the drain region 9D of the N channel side are formed with a fine pattern As+ arsenic ions are inevitably used. In this case, since the projection range R$_p$ of arsenic ions As+ are small, it is very difficult to carry out ion implantation through the thin insulating layers (gate oxide layers) 2 which have a thickness of about 400 Å during the process shown in FIG. 1C.

When the source region 8S and the drain region 8D of the P channel side are formed by the ion-implantation technique, polycrystalline silicon containing phosphorus (polycrystalline silicon containing boron B is difficult to use in view of BT (bias-temperature) stability and the stability of threshold voltage, and the polycrystalline silicon layer 3 of the gate portions which serves as the mask for the source and drain regions ions of, boron are implanted by a self-alignment process shown in FIG. 1B, but it will have a dosage of $5 \times 10^{14}$ cm$^{-2}$. Inherently, in order to lower the resistance value of the source region 8S and the drain region 8D of the P channel side, B+ ions of boron having a dosage of $5 \times 10^5$ cm$^{-2}$ are necessary. As a result, the resistance value of the source and drain regions 8S and 8D of the P channel side becomes as high as about 200 Ω/ε with the result that the characteristics of the P channel MOS transistor are deteriorated.

Further, since B+ ions of boron are implanted into the polycrystalline layer 3 at the dosage of $5 \times 10^{14}$ cm$^{-2}$, the resistance value of the polycrystalline silicon layer 3 of the gate portion is raised. In addition, work function $\phi$ms of the gate is changed and thus the threshold voltage becomes variable in different components.

OBJECTS AND SUMMARY OF THE INVENTION

Accordingly, it is an object of this invention to provide an improved manufacturing method of a complementary metal oxide semiconductor transistor.

It is another object of this invention to provide a manufacturing method of a semiconductor apparatus capable of producing a complementary metal oxide semiconductor transistor of high performance.

According to one aspect of this invention, there is provided a manufacturing method of a semiconductor device comprising the steps of:

forming oxide layers on a major surface of a substrate at its first and second portions;

forming first and second semiconductor layers, each being of a predetermined conductivity type and with a predetermined pattern, on said oxide layers of said first and second portions;

forming a first region by introducing an impurity of the first conductivity type into said substrate while using said first semoconductor layer as a mask;

etching out said oxide layer on said second portion by using said second semiconductor layer as a mask;

forming a second region by introducing an impurity of the second conductivity type into said substrate while using said second semiconductor layer as a mask; and forming oxide layers on the surfaces of said first semiconductor layer, said second semiconductor layer and said second region by a thermal oxidization process.

According to the manufacturing method of the invention, when the second region of fine patterning is formed, the second conductivity type impurity having small projection range $R_p$ is used so that the efficiency of the C-MOS transistor is improved to be high.

The other objects, features and advantages of the present invention will become apparent from the following description taken in conjunction with the accompanying drawings through which the like references designate the same elements and parts.

DESCRIPTION OF THE PREFERRED EMBODIMENTS

Now, an embodiment of the manufacturing method for producing a C-MOS (complementary metal oxide semiconductor) transistor according to this invention will hereinafter be described with reference to FIGS. 2A to 2I. In FIGS. 2A to 2I, like parts corresponding to those in FIGS. 1A to 1G are marked with same references and will not be described in detail.

Figure 2A:
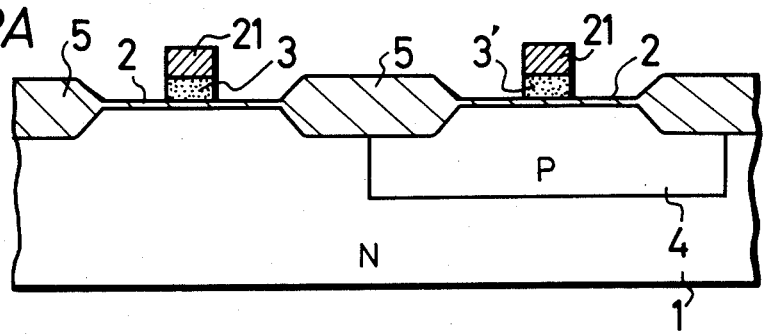
FIGS. 2A to 2I are respectively schematic cross-sectional diagrams showing the processes of an embodiment of a manufacturing method for producing a C-MOS transistor according to the present invention.

In this invention, as shown in FIG. 2A, on one major surface of the second conductivity type semiconductor substrate, for example, N conductivity type silicon semiconductor substrate 1 having the first conductivity type, for example, P conductivity type island region 4 are formed at portions where N- and P-channel MOS transistors are respectively to be formed. Thin oxide layers (for example, SiO$_2$ layers) 2 are formed which will become thin insulating layers. Formed on the field portions of the substrate 1 are the thick field oxide layers (SiO$_2$ layers) 5 by, for example, the selective oxidation. After the polycrystalline silicon layer containing phosphorus is deposited on the surface thereof, the first photoresist layers 21 are used as the mask and the polycrystalline silicon layer is selectively etched so as to leave the polycrystalline silicon layers 3 and 3' at the positions correspnding to the gates. The polycrystalline silicon layers 3 and 3' become the gate electrodes.

Figure 2B:
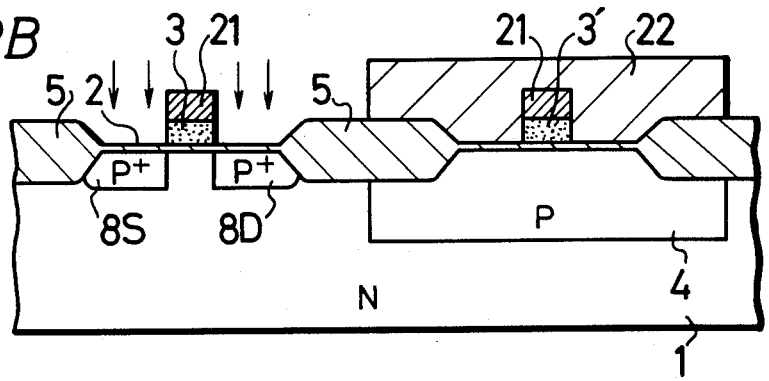

Then, as shown in FIG. 2B, under the condition where the first photoresist layers 21 are left on the polycrystalline silicon layers 3 and 3', the N channel side is coated with a second photoresist layer 22 and boron is implanted into the substrate 1 with a dosage of $5\times10^{15}$ cm$^{-2}$ to thereby form a P type source region 8S and a P type drain region 8D, respectively, in the P channel side.

Figure 2C:
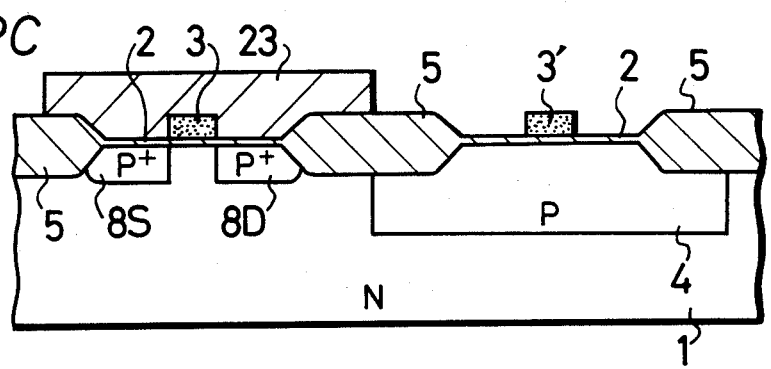
Figure 2D:
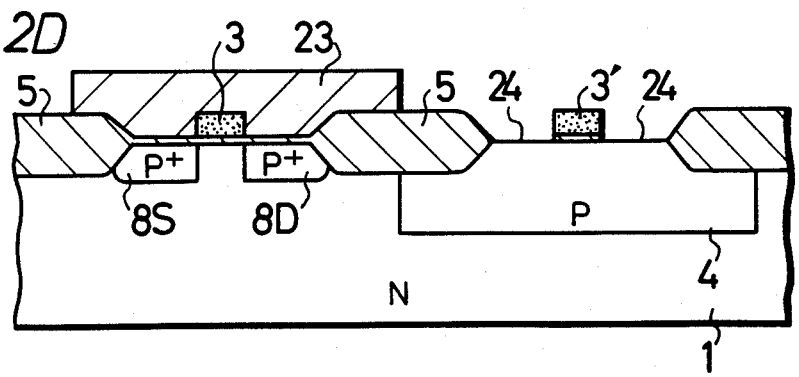

Subsequently, as shown in FIG. 2C, the first and second photoresist layers 21 and 22 are removed and the P channel side is coated with a third photoresist layer 23. Thereafter, the polycrystalline silicon layer 3' and the field oxide layers 5 are used as the masks and the thin oxide layer 2 of the N channel side is removed by slight etching to form source and drain forming window apertures 24 (FIG. 2D).

Figure 2E:
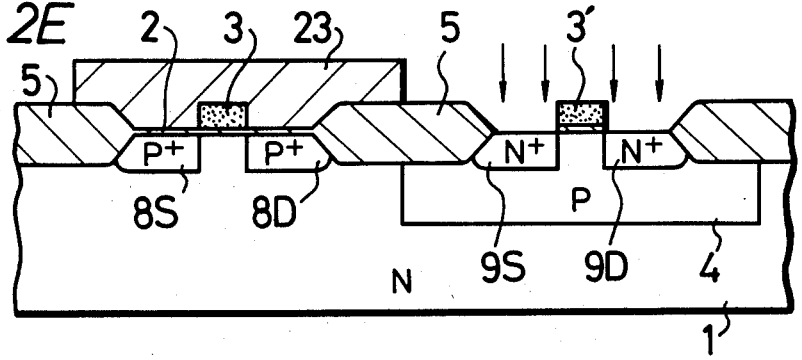

Then, as shown in FIG. 2E, through the window apertures 24, arsenic ions As$^+$ are implanted into the substrate 1 at the N channel side with a dosage of $5\times10^{15}$ cm$^{-2}$ to form source region 9S and drain region 9D of the N channel side, respectively.

Figure 2F:
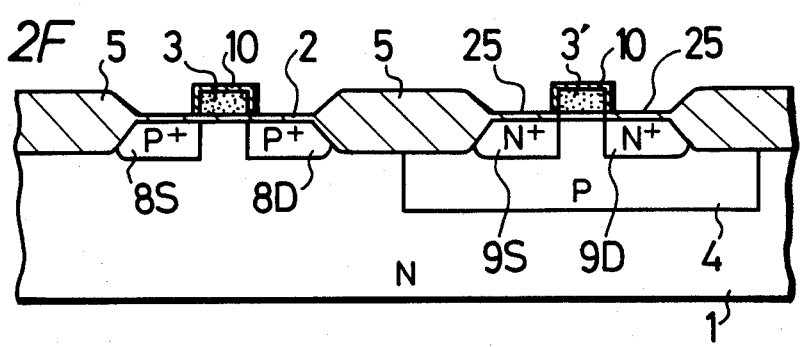

Next, as shown in FIG. 2F, after the third photoresist layer 23 is removed, a light oxidation process is carried out to form oxide layers 10 on the surfaces of the polycrystalline silicon layers 3 and 3' of both the gate portions, respectively and oxide layers 25 are respectively formed on the exposed silicon portion of the N channel side (on the surfaces of the source and drain regions 9S and 9D). The oxidation treatment at that time is controlled such that the thickness of the oxide layer 25 on the silicon exposed portion of the N channel side becomes the same as that of the oxide layers 2 on the source and drain regions 8S and 8D of the P channel side.

The reason for this is that since the oxidation speed on the N$^+$ type region is faster than that on the P$^+$ type region by about three times and is substantially the same as the oxidation speed on the polycrystalline silicon layer containing impurities all of the oxide layers on the N$^+$ type source and drain regions 9S, 9D, the P$^+$ type source and drain regions 8S, 8D and the polycrystalline silicon layers 3, 3' will have substantially the same thickness.

Figure 1A:
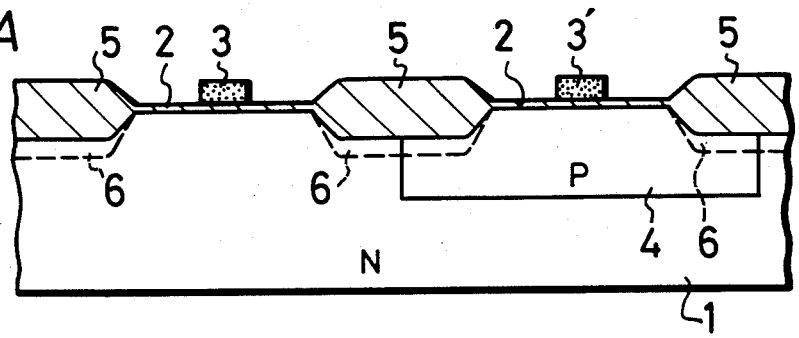
FIGS. 1A to 1G are respectively schematic cross-sectional diagrams showing the processes of a prior art manufacturing method for producing a C-MOS (complementary metal oxide semiconductor) transistor.
Figure 1B:
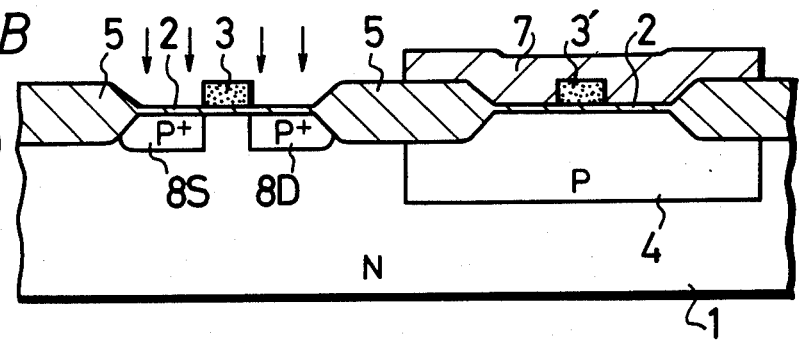
Figure 1C:
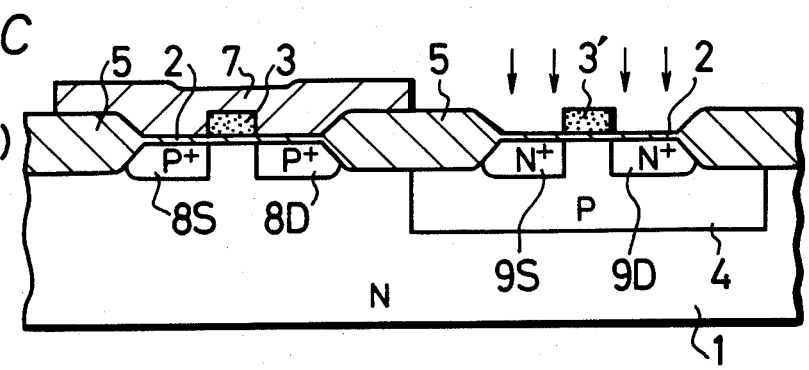
Figure 1D:
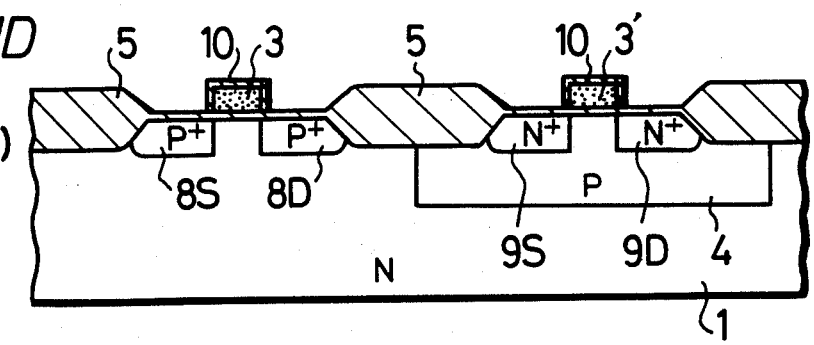
Figure 1E:
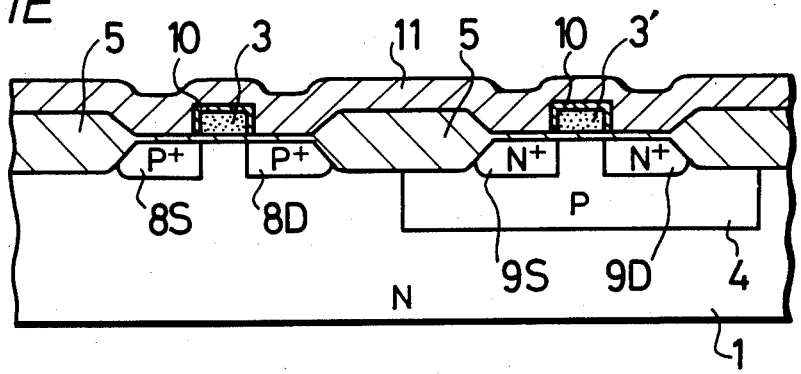
Figure 1F:
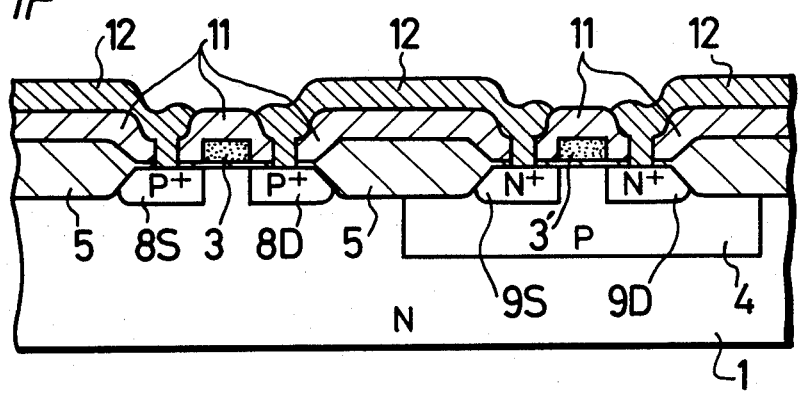
Figure 1G:
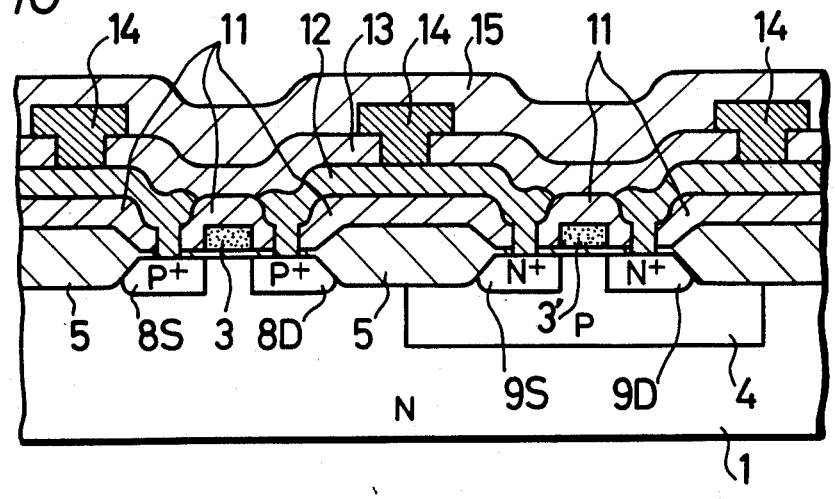
Figure 2G:
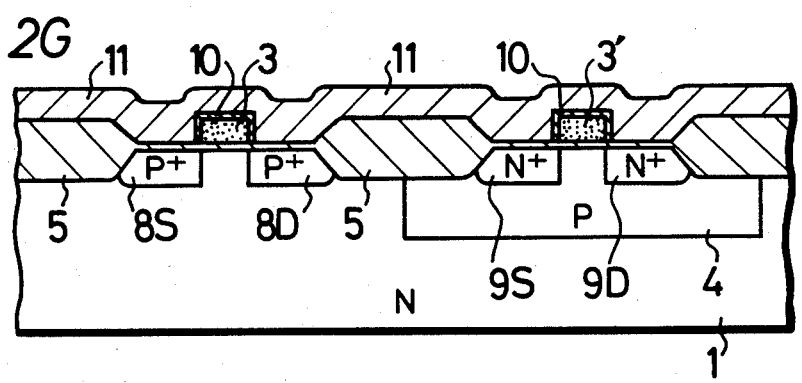
Figure 2H:
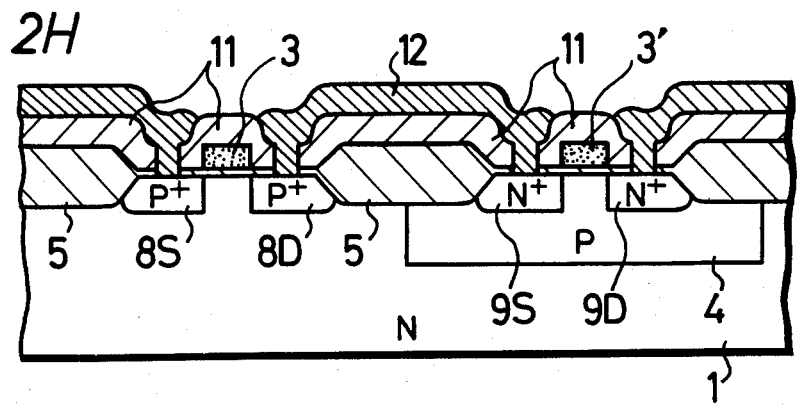

The following processes shown in FIGS. 2G to 2I of this invention are the same as those described in connection with FIGS. 1E to 1G. That is, the silicate glass layer 11 such as arseno-silicate glass, phospho-silicate glass or the like is deposited on the entire surface by the CVD (chemical vapor deposition) technique (see FIG. 2G). Then, contact window apertures for the source and drain regions are formed through the silicate glass layer 11 and a glass flow treatment is carried out. Thereafter, the first wiring contact 12 made of Al is formed (FIG. 2H).

In the case of employing a double layer wiring contact structure, a layer insulating layer 13 made of, for example, silicate glass layer for insulating adjacent layers is deposited and then through the insulating layer 13 contact window apertures are formed at predetermined positions. Thereafter, the second wiring contact 14 made of Al is formed and then the insulation protective layer 15 is formed on the surfaces (FIG. 2I).

The desired C-MOS transistor is manufactured as described.

In accordance with the above manufacturing method of the invention, when the source and drain regions 8S and 8D of the P channel side are formed by the ion implantation technique, under the condition where the photoresist layer 21 remains on the polycrystalline silicon layer 3 of the gate portion and is used as the mask when, the ion implantation of B$^+$ ions of boron is carried out the ions B$^+$ can be implanted with a dosage of about $5\times10^{15}$ cm$^{-2}$. Accordingly, the resistance value of the source and drain regions 8S and 8D can be reduced from that of the prior art value of 200 $\Omega/\square$ to 40 $\Omega/\square$. At the same time, in the case of the B$^+$ ion implantation, since the polycrystalline silicon layer 3 at the gate portion of the P channel side is protected by the first photoresist layer 21, it is possible to prevent the increase of the resistance of the polycrystalline silicon layer 3 and also to prevent the threshold voltage Vth from being dissipated by the change of the work function $\phi$ms.

When the source and drain regions 9S and 9D of the N channel side are formed, in the process shown in FIG. 2D, the thin oxide layer 2 is selectively etched out to expose the surface of the Si substrate and then AS+ ions of arsenic is implanted therein so that As ions of arsenic having a small projection range $R_p$ can be easily implanted. As a result, it becomes possible to form the source and drain regions in a shallow and fine pattern. Furthermore, by utilizing the fact that the oxidation speed on the N+ region is faster than the oxidation speed on the P+ region by about three times and is substantially the same as the oxidation speed on the polycrystalline silicon layer containing impurity, during the oxidation treatment process as shown in FIG. 2F, the thickness of the oxide layers on the respective source regions and drain regions of the P channel and N channel sides can be controlled so that they are the same. For this reason, the succeeding formed first wiring contact windows for the first wiring contact can be accurately and clearly formed.

Figure 2I:
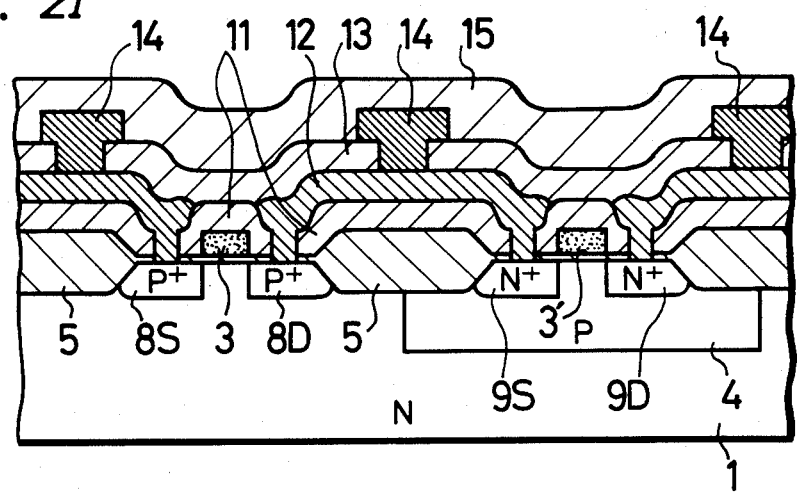
Figure 3:
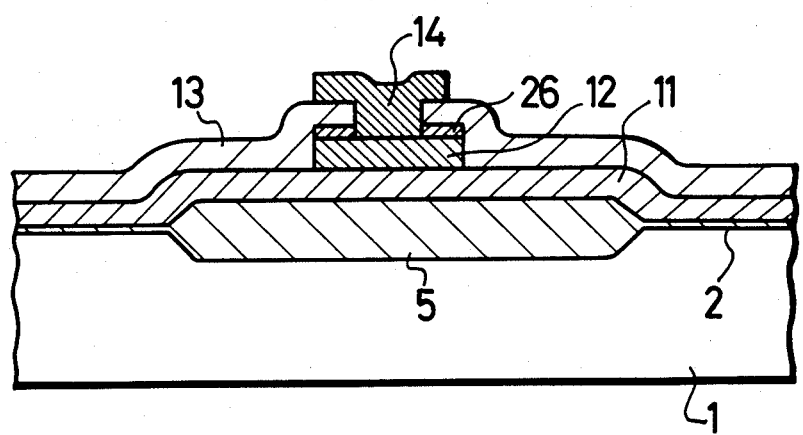
FIG. 3 is a cross-sectional diagram showing another embodiment of a double layer wiring structure of a C-MOS transistor according to the present invention.

The double layer wiring portion shown in FIG. 2I can be constructed as shown in FIG. 3. In FIG. 3, when a nitride layer 26 formed by plasma CVD is formed on the first wiring contact 12 made of Al as a part of the layer insulating layer 13, the plasma nitride layer 26 is formed only on the first wiring contact 12 and prevented from being in contact with the silicate glass layer 11 under the first wiring 12. The purpose of using the plasma nitride layer 26 as a part of the layer insulating layer 13 is as follows. First, when the insulating layer 13 made of $SiO_2$ is deposited by the CVD technique, short circuiting is avoided of the layers of the first wiring contact 12 and the second wiring 14 by a protrusion called hillock which will take place on the first wiring contact 12 made of Al. Secondly, when a solution of etchant is used for forming the contact windows through the insulating layer 13, Al of the first contact wiring 12 or the surface of the first wiring contact 12 is corroded so that the interconnection between the first wiring contact 12 and the second wiring contact 14 cannot be carried out satisfactorily. However, when plasma nitride is used, the etching is carried out by using the plasma so that the surface of the first wiring contact is finished dry, and thus interconnecting of the first and second wiring is accomplished. However, in general, since the plasma nitride layer is formed after the first wiring contact is formed, the plasma nitride layer and the silicate glass layer are superposed on each other and hence plus charges of $10^{12}$ charges/cm$^2$ are generated on the boundary surface therebetween, inverting the P type surface under the field portion to an N type surface. However, according to the structure shown in FIG. 3, with the advantage inherent to the plasma nitride, it is possible to prevent the portion under the field portion from being inverted by the plasma nitride layer 26 and the silicate glass layer 11.

According to the present invention as described above, the present invention comprises a step such that the second semiconductor layer is used as the mask to etch out the oxide layer and the second semiconductor layer is used as the mask to introduce the second conductivity type impurity into the substrate thereby to form the second region, so that the impurity having a small projection range $R_p$ can be used as the second conductivity type impurity, thus resulting in that the second region can be made with a shallow and fine pattern. In addition, in the thermal oxidation treatment of the following process, the oxide layers of the same thickness can be formed on the first and second regions so that the contact windows can be clearly and accurately formed in the next process. Thus, according to the present invention, it is possible to manufacture a C-MOS transistor of high efficiency.

The above description is given for the preferred embodiments of the invention, but it will be apparent that many modifications and variations could be effected by one skilled in the art without departing from the spirit or scope of the novel concepts of the invention, so that the scope of the invention should be determined by the appended claim only.

We claim as our invention:
1. A method for forming CMOS transistors comprising the steps of, forming a portion of a second conductivity type (4) in a semiconductor substrate (1) to form first and second portions where p and n channel CMOS transistors are to be formed, forming thin oxide layers (2) over said first and second portions (1 and 4) where said p and n channel MOS transistors are to be formed, forming thick insulating layers (5) on said first and second portions where said p and n channel transistors are not to be formed, applying a polycrystalline silicon layer containing phosphorous over said first and second portions, applying a first photoresist layer (21) on said polycrystalline silicon layer and exposing it to light to remove portions thereof, selectively etching said polycrystalline layer (2) using said first photo resist layer 21 as a mask to form gate electrodes (3, 3'), coating the n channel transistor portion with a second photoresist layer 22, implanting boron into said substrate to form p type source and drain regions (8S and 8P) in the P transistor, removing said first and second photoresist layer (21, 22), applying a third photoresist layer 23 to the p type transistor, removing said thin oxide layer 2 over the n type transistor to form source and drain forming windows, implanting arsenic ions through said windows to form source and drain regions 9S and 9D, forming thin oxide layers 10 on the polycrystalline gate portions 3 and 3', forming oxide layers 25 on the exposed n channel portion on the source and drain regions 9S and 9D such that the thickness of the oxide layer 25 on the silicon exposed portion of the n channel is the same as the oxide layers 2 on the source and drain (8S and 8D) of the p channel transistor, applying a silicate glass layer 11 over both the n and p channel transistors, forming contact apertures for the source and drains through said silicate glass layer 11, and forming wiring contacts on said substrate to said source and drain regions.

* * * * *